United States Patent [19]

Daughtry, Jr. et al.

[11] Patent Number: 5,875,388
[45] Date of Patent: Feb. 23, 1999

[54] CRYSTAL OSCILLATOR WITH AUTOMATIC COMPENSATION FOR AGING AND TEMPERATURE

[75] Inventors: Earl A. Daughtry, Jr., Lawrenceville; Christopher S. Quire, Alpharetta; Mark A. Ruff, Cumming; Richard M. Stone, Suwanee, all of Ga.

[73] Assignee: Matsushita Communication Industrial Corporation of America, Peachtree, Ga.

[21] Appl. No.: 896,697

[22] Filed: Jul. 18, 1997

Related U.S. Application Data

[62] Division of Ser. No. 387,058, Feb. 10, 1995, Pat. No. 5,659,884.

[51] Int. Cl.$^6$ ..................................................... H04B 1/16
[52] U.S. Cl. ..................... 455/67.1; 455/226.1; 455/255; 331/158; 331/176
[58] Field of Search .................................. 455/550, 575, 455/84, 75–77, 67.1, 226.1, 115, 255.7, 259, 265; 331/158, 176

[56] References Cited

U.S. PATENT DOCUMENTS

| | | | |
|---|---|---|---|
| 4,922,212 | 5/1990 | Roberts et al. | 331/176 |
| 5,081,652 | 1/1992 | Farahati et al. | 455/256 X |
| 5,201,063 | 4/1993 | Tam et al. | 455/115 |
| 5,204,975 | 4/1993 | Shigemori | 455/256 X |
| 5,392,005 | 2/1995 | Bovtolini et al. | 331/176 |
| 5,423,070 | 6/1995 | Vaisaneu et al. | 455/226.1 |
| 5,477,194 | 12/1995 | Nagakuua | 331/176 |

FOREIGN PATENT DOCUMENTS

| | | |
|---|---|---|
| 0 483 090 A1 | 4/1992 | European Pat. Off. . |
| 2 205 460 | 12/1988 | United Kingdom . |
| WO 88/01810 | 3/1988 | WIPO . |
| WO 90/16113 | 12/1990 | WIPO . |

OTHER PUBLICATIONS

Methot, Francois, "Crystal Osillator Compensation in a DDS/PLL Application", *RF Design Awards*, pp. 88–89, Jan. 1995.

*Primary Examiner*—Wellington Chin
*Assistant Examiner*—Philip J. Sobutka

[57] ABSTRACT

A method and an apparatus for compensating for aging and temperature of the crystal in a crystal oscillator. An RF signal which is transmitted by a mobile telephone switching office (MTSO) (108) and received by the antenna (118). The signal transmitted by the MTSO (108) serves as an external reference. A crystal-controlled main oscillator/time base generator (134) provides a local reference frequency to the converters (120) and provides a time base signal to a counter (136). A controller (112) reads an aging correction value from a memory and provides a frequency control signal to the main oscillator (134). The converters (120) convert the received RF signal to an IF frequency. A limiter (122) provides a limited IF signal to the counter (136). Counter (136) counts the number of cycles of the limited IF signal that appear in a cycle of the time base signal. A controller (112) compares this measured count to a reference count and the count error is determined. The count error is compared to an allowable count error. If the count error is excessive then the controller (112) adjusts the frequency control signal provided to the main oscillator (134) so as to change the frequency of the main oscillator (134). Once the controller (112) has shifted the frequency so that the count error is not excessive then the controller (112) stores the new aging correction value. The measured count is therefore depends upon the frequency of the main oscillator (134) and the frequency of the received signal. This process automatically compensates for the frequency of the main oscillator (134) and, therefore, for aging of the crystal. The frequency of oscillation of the main oscillator (134) is therefore as accurate as the external reference, typically the highly accurate MTSO (108). A high precision oscillator (134) has thus been obtained using an external reference (MTSO 108) and an aging correction value.

16 Claims, 5 Drawing Sheets

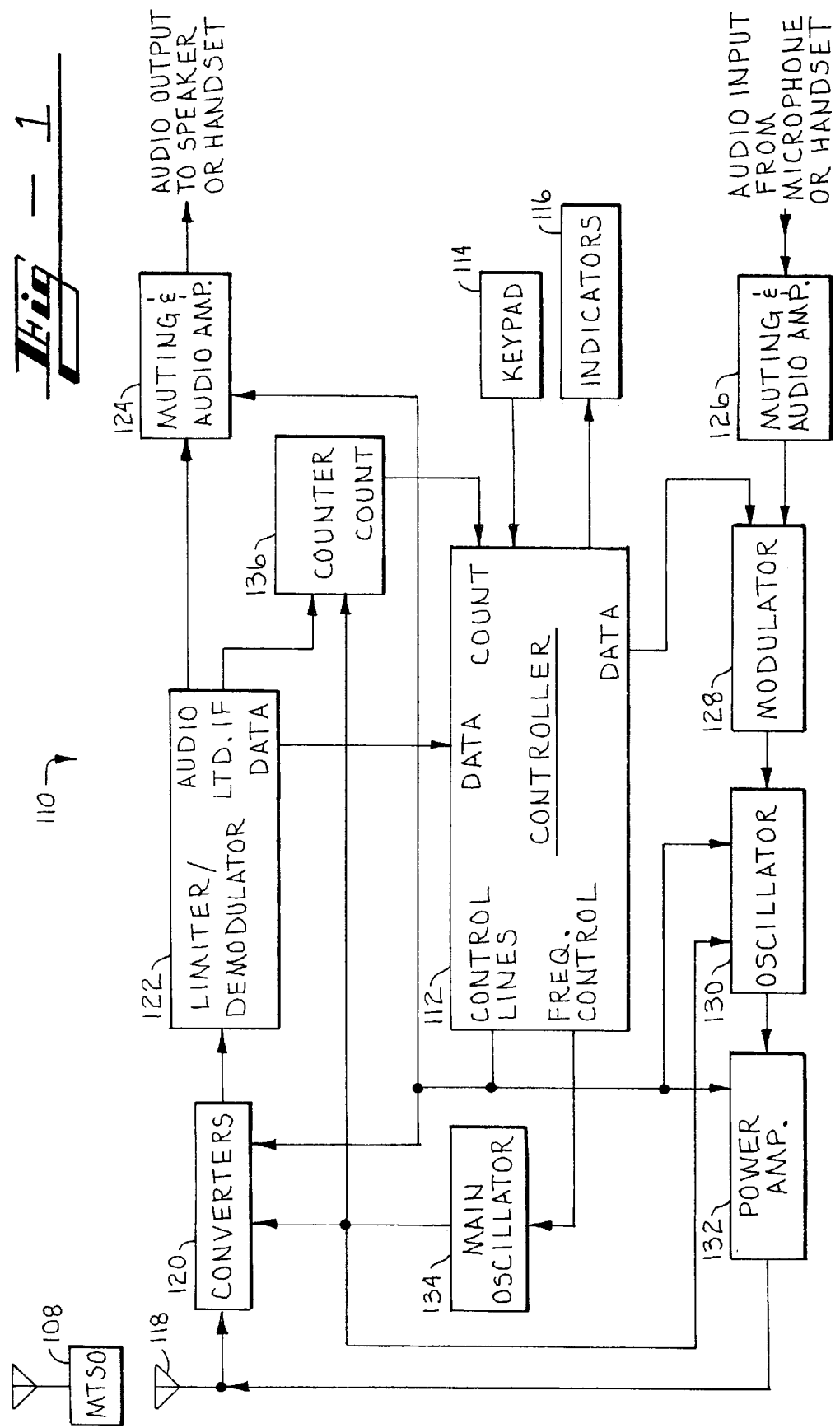

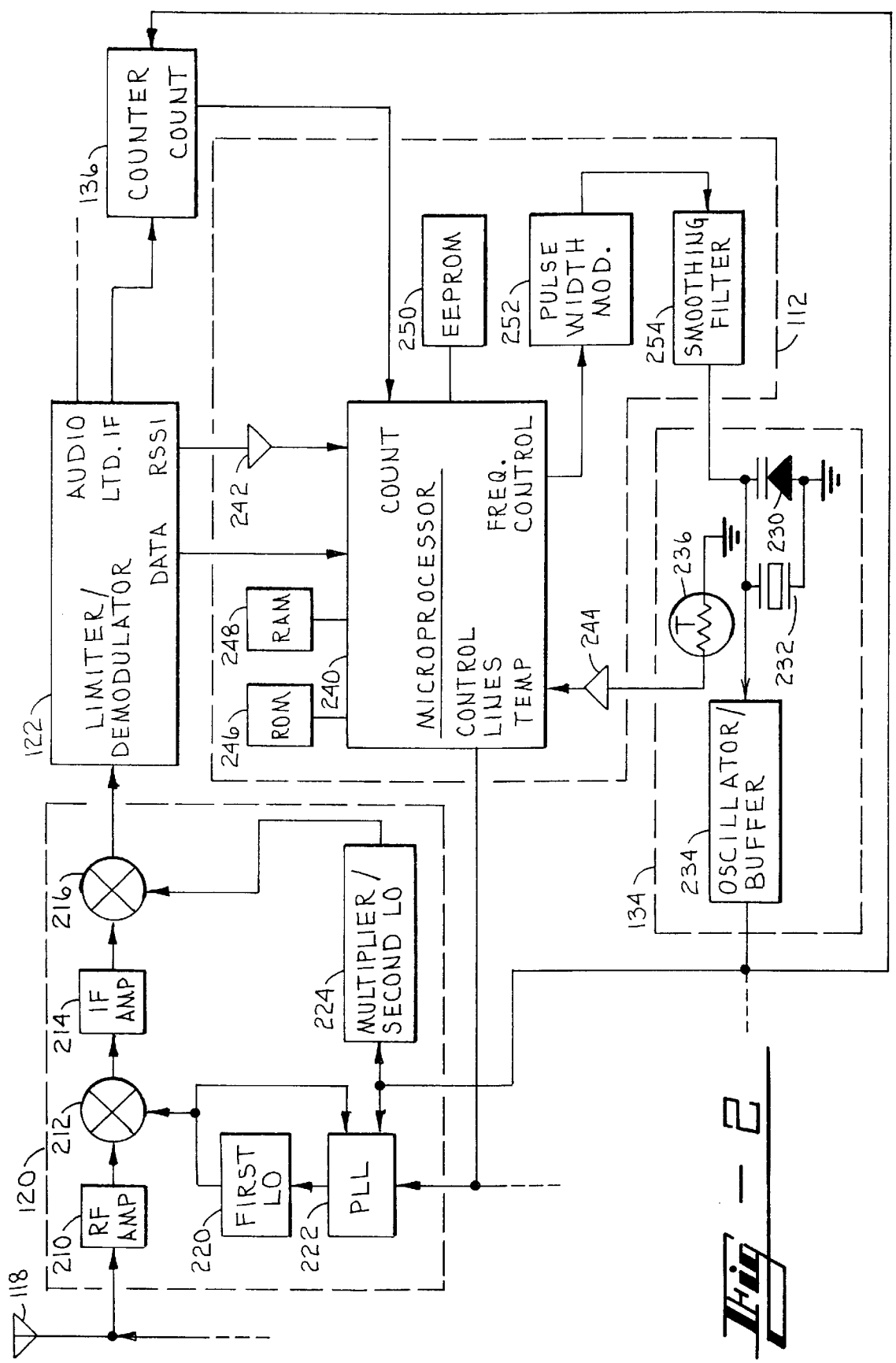

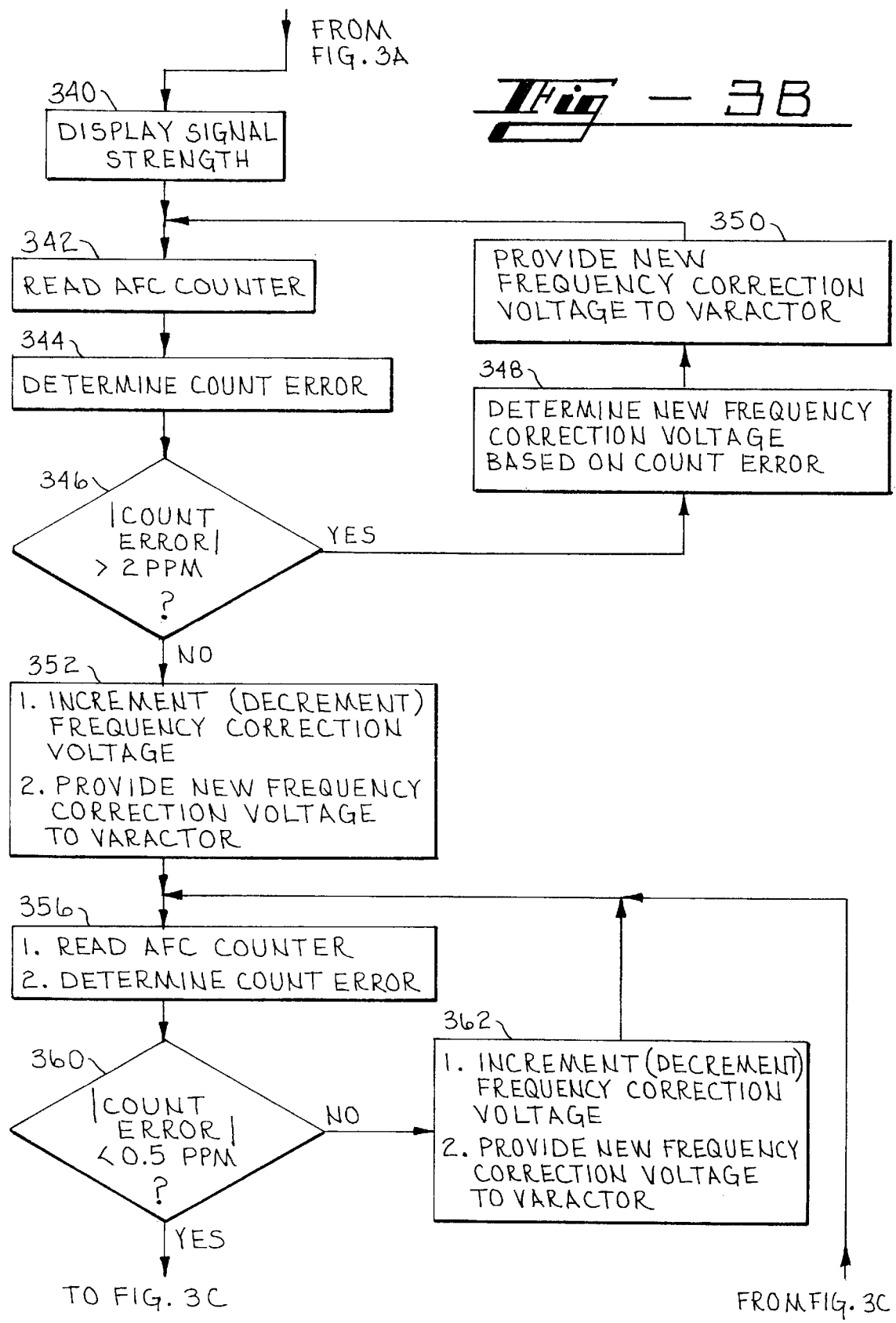

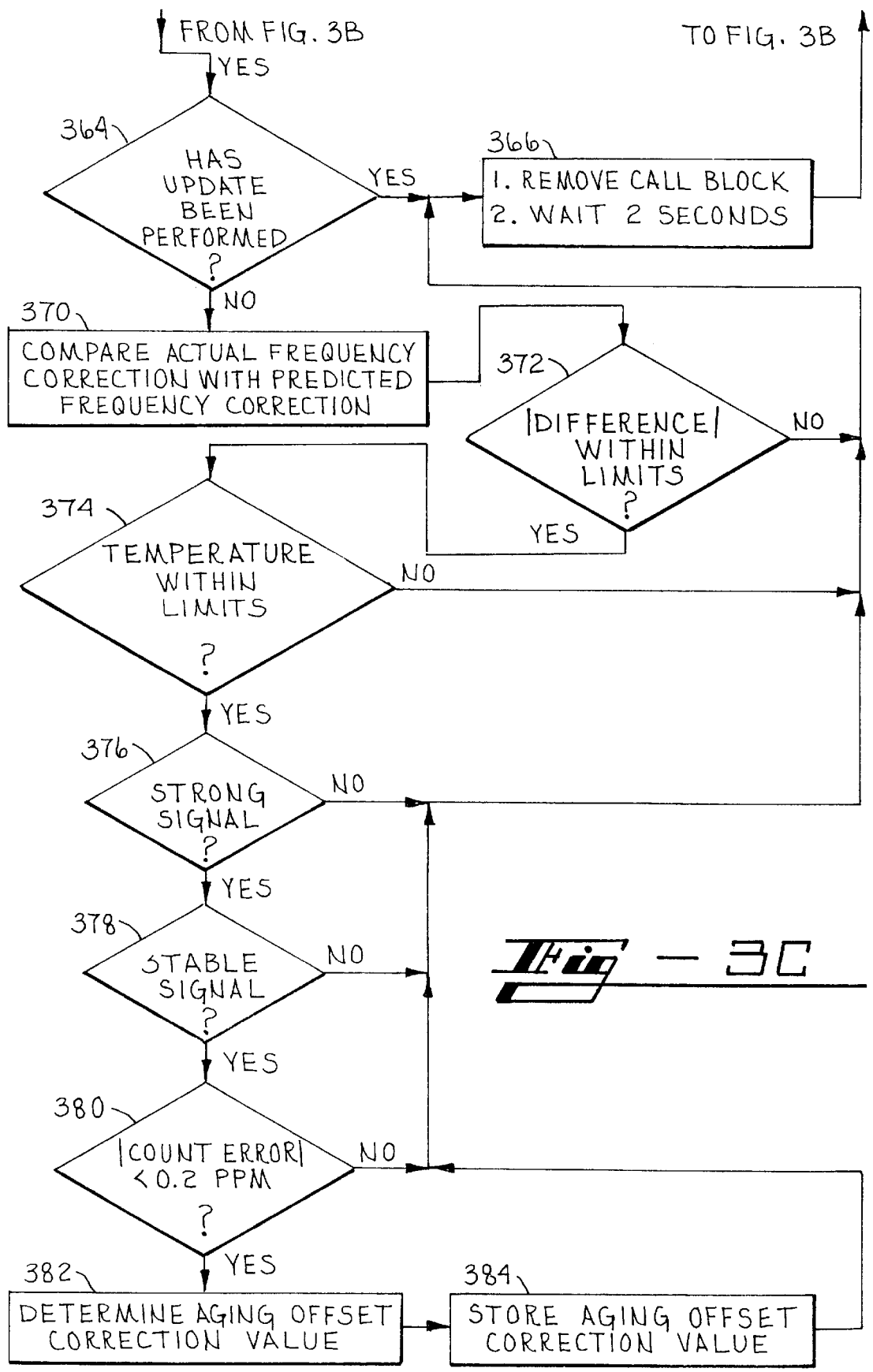

CRYSTAL OSCILLATOR WITH AUTOMATIC COMPENSATION FOR AGING AND TEMPERATURE

This is a division of application Ser. No. 08/387,058, filed Feb. 10, 1995, now U.S. Pat. No. 5,659,884.

TECHNICAL FIELD

This invention relates to crystal oscillators and, more particularly, is for a method and an apparatus for automatically compensating for the effects of aging and temperature in a crystal oscillator.

BACKGROUND OF THE INVENTION

In order to comply with Federal Communications Commission Regulations and to prevent interference with other radiotelephones, a radiotelephone, such as a cellular, portable, or mobile radiotelephone device, requires a high precision crystal oscillator. Many current radiotelephones use an AT-cut crystal for the crystal oscillator. An AT-cut crystal has the most stable frequency over temperature.

Some devices use temperature compensation to further increase the frequency stability of the crystal oscillator over the desired temperature range. In these devices a temperature-dependent network is used to influence the frequency of the oscillator. For example, a temperature measuring device is used to determine the temperature and adjust the voltage applied to a tuning device, such as a varactor, which is connected to the crystal. Buffering is used to isolate the oscillator from the effects of its environment and connected load, such as the stage to which the oscillator is connected. Such a device is frequently referred to as a Temperature Compensated Crystal Oscillator (TCXO).

To further increase the accuracy of the oscillator, an automatic frequency control (AFC) loop is sometimes added to a TCXO. This type of device is frequently referred to as a Voltage Controlled Temperature Compensated Crystal Oscillator (VCTCXO). This device requires two inputs to the oscillator circuit: one input for the temperature sensing circuit, and one input for the AFC. The TCXO tracks the frequency of the external reference as long as the external reference is available. However, if the external reference disappears or even momentarily drops out, then the VCTCXO will lose its tracking and will rely only upon temperature compensation. However, if the aging is sufficiently severe and the channel spacing is sufficiently narrow, the VCTCXO may not stay tuned to the correct channel.

Another type of high precision crystal oscillator is the Digitally-Compensated Crystal Oscillator (DCXO). This device uses a dedicated controller whose sole function is to compensate for the changes in crystal frequency due to temperature. The manufacturer "trains" the dedicated controller for each DCXO by measuring the frequency of oscillation of the crystal of that DCXO at different temperatures and providing the dedicated controller with a correction table which specifies the amount of offset needed for each given temperature. This oscillator requires only one input but is expensive because a dedicated controller is required for each crystal and, further, each crystal must be individually calibrated in order to generate a correction table so that the dedicated controller will be able to compensate for the temperature characteristics of that particular crystal.

However, crystals are not subject only to the effects of temperature. They are also subject to the effects of aging. As a crystal ages the frequency of oscillation changes. This change is in addition to any change that is caused by temperature. Therefore, after a while, the prior art frequency-temperature correction table is no longer accurate. None of the prior art devices compensate for aging. These devices merely compensate for temperature variations.

This aging does have an effect on the VCTCXO if the VCTCXO does not have a frequency reference which it can track. That is, until the VCTCXO receives a reference signal, the VCTCXO can only compensate for temperature changes because it does not have a reference signal which it can track. This can cause the radiotelephone to operate outside of the allowable tolerance established by Federal Communications Commission (FCC) or other appropriate governing body regulations. If the channel spacing is very narrow and the aging is severe the radiotelephone may listen for instructions from the Mobile Telephone Switching Office (MTSO) on the wrong channel, thereby preventing the radiotelephone from establishing communications with the MTSO. In this case the radiotelephone will appear to be inoperative.

Some manufacturers attempt to compensate for aging by pre-aging (burning-in) the crystals. However, this increases the cost of the crystals, and only compensates for the initial aging of the crystal (infant aging) and does not compensate for long-term or cumulative aging.

Therefore, there is a need for an oscillator which is temperature stable and which is not dependent upon a reference signal for its accuracy.

There is also a need for an oscillator which has compensation for the effects of aging.

There is also a need for an oscillator which can use an AT-cut crystal which is not pre-aged.

There is also a need for a radiotelephone which uses a low cost oscillator circuit.

There is also a need for an oscillator which has compensation for the effects of temperature without using a dedicated microcontroller.

There is also a need for an oscillator which does not require temperature training and/or testing.

There is also a need for a radiotelephone which maintains minimum frequency error, even when an external reference is temporarily not available.

SUMMARY OF THE INVENTION

The present invention provides a method and an apparatus for compensating for the effects of aging in a crystal.

The present invention therefore provides a crystal oscillator which is temperature compensated and which is further compensated for the effects of aging of the crystal.

The present invention also provides a radiotelephone which is temperature compensated and which is further compensated for the effects of aging of the crystal in the oscillator of the radiotelephone.

Briefly described, the present invention is a crystal oscillator which is controlled by a microprocessor and which compensates for both aging and temperature. The microprocessor reads the temperature and inspects a frequency-temperature correction table to determine the correction required to compensate for the temperature. The frequency-temperature correction table is representative of the frequency-temperature relationship for the type of cut (AT-cut, etc.) of the particular crystal. If desired, each crystal may be provided with a frequency-temperature correction table tailored for that particular crystal, but this does increase the cost. The table may also be represented by an equation. The microprocessor also reads an aging correction value from memory to determine the correction required to compensate for aging. The microprocessor then combines these two correction values to provide a net correction value. The net correction value is applied to the crystal oscillator as a frequency control output signal. This initially sets the frequency of oscillation of the crystal oscillator and this initial frequency has been compensated for both aging and temperature. Of course, aging is an ongoing process, so the aging correction value is updated. In the preferred embodiment, aging is performed each time the radiotelephone is powered up. However, the aging correction value may be updated as desired, such as continuously, or every hour, etc. In the process of updating the microprocessor compares the frequency of oscillation of the crystal oscillator with the frequency of an external reference source and determines the amount of error in the crystal oscillator frequency. If the error exceeds a predetermined allowable error amount then the microprocessor adjusts the frequency control output signal until the amount of error in the oscillation frequency is within the predetermined threshold. The microprocessor then updates the aging correction value so that the frequency-temperature relationship is accurate again. Thus, the present invention automatically compensates for the effects of aging.

In one version of the present invention, the aging value is used to modify the data in the frequency-temperature correction table, rather than being stored separately from such data. In this version the microprocessor only has to read the data from the modified frequency-temperature correction table because the aging correction value has already been included in the modified table.

The present invention does not require a dedicated microprocessor to control the crystal oscillator. Many devices, such as radiotelephones, use a microprocessor to control the operation of the device itself. The present invention uses this same microprocessor to control the oscillator by reading the correction table and controlling the oscillation frequency. Therefore, a separate microprocessor is not required to control the oscillator.

The net correction value is always current and the oscillation frequency is accurate, even when the external reference is not present. For example, when the radiotelephone is first turned on, or first comes into a service area from a no-service area, the radiotelephone will apply the net correction value, which compensates for aging and temperature, and therefore the radiotelephone will be transmitting and/or receiving on the correct channel(s).

The present invention therefore compensates for aging of a crystal in an oscillator.

The present invention provides a method for controlling the frequency of an oscillator to compensate for aging. This method includes reading from a memory to determine an aging correction value for the oscillator, and providing the aging correction value to the oscillator.

Another method for controlling the frequency of an oscillator to compensate for aging and temperature includes determining a temperature of operation for the oscillator, obtaining a frequency-temperature correction value for the oscillator for the temperature, obtaining an aging correction value for the oscillator, combining the frequency-temperature correction value and the aging correction value to provide a frequency correction value, and providing the frequency correction value to the oscillator.

Another method for controlling the frequency of an oscillator to compensate for aging and temperature includes determining a temperature of operation for the oscillator, obtaining a combined aging and temperature correction value for the oscillator for the temperature, and providing the combined aging and temperature correction value to the oscillator.

The present invention also provides a method for updating of the compensation for the aging of the crystal. This method includes determining a temperature of operation for the oscillator, obtaining a frequency-temperature correction value for the oscillator for the temperature, obtaining an aging correction value for the oscillator, combining the frequency-temperature correction value and the aging correction value to provide an initial frequency correction value, providing the initial frequency correction value as a frequency correction value to the oscillator, determining a frequency difference between the frequency of the oscillator and the frequency of a reference, and updating the aging correction value to compensate for the frequency difference.

The process of updating the aging correction value includes determining a new aging correction value and storing the new aging correction value as the aging correction value if the frequency difference is less than a maximum frequency difference.

More particularly, if the frequency difference is not less than the maximum frequency difference then adjusting the frequency correction value, providing the frequency correction value to the oscillator, and determining the frequency difference between the frequency of the oscillator and the frequency of the reference, and repeating the steps of adjusting the frequency correction value, providing the frequency correction value, and determining the frequency difference until the frequency difference is less than the maximum frequency difference, and if the frequency difference is less than a maximum frequency difference then determining a new aging correction value and storing the new aging correction value as the aging correction value.

The process of determining the new aging correction value includes determining a correction difference between the frequency correction value and the frequency-temperature correction value, and using the correction difference as the new aging correction value. The process of determining the new aging correction value may include determining a correction difference between the frequency correction value and the frequency-temperature correction value, and if the correction difference is less than a maximum correction difference then using the correction difference as the new aging correction value. The process of determining the new aging correction value may include determining a correction difference between the frequency correction value and the frequency-temperature correction value, and if the correction difference is greater than a minimum correction difference and less than a maximum correction difference then using the correction difference as the new aging correction value.

The present invention also provides a method for updating of the compensation for the aging of the crystal where temperature is taken into consideration. This method includes determining a temperature of operation for the oscillator, obtaining a combined aging and temperature correction value for the oscillator at the temperature, providing the combined aging and temperature correction value as a frequency correction value to the oscillator, determining a frequency difference between the frequency of the oscillator and the frequency of a reference, and updating the combined aging and temperature correction value to compensate for the frequency difference.

More particularly, if the frequency difference is not less than a maximum frequency difference then adjusting the frequency correction value to provide an adjusted frequency correction value, providing the adjusted frequency correction value as the frequency correction value to the oscillator, and determining the difference between the frequency of the oscillator and the frequency of the reference, and repeating the steps of adjusting the frequency correction value, providing the frequency correction value, and determining the frequency difference until the frequency difference is less than the maximum frequency difference, and if the frequency difference is less than the maximum frequency difference then determining a new combined aging and temperature correction value and storing the new combined aging and temperature correction value as the combined aging and temperature correction value.

The process of determining the new combined aging and temperature correction value includes determining a correction difference between the combined aging and temperature correction value and the adjusted frequency correction value, and using the correction difference as the new combined aging and temperature correction value. The process of determining the new combined aging and temperature correction value may also include determining a correction difference between the adjusted frequency correction value and the combined aging and temperature correction value, and if the correction difference is less than a maximum correction difference then using the correction difference as the new combined aging and temperature correction value. The process of determining the new combined aging and temperature correction value may also include determining a correction difference between the adjusted frequency correction value and the combined aging and temperature correction value, and if the correction difference is greater than a minimum correction difference and less than a maximum correction difference then using the correction difference as the new combined aging and temperature correction value.

The present invention also provides an oscillator. The oscillator has a crystal, a tuning device for tuning the frequency of oscillation of the crystal to a desired frequency of operation, an oscillator circuit connected to the crystal and the tuning device for causing the crystal to oscillate, a memory containing an aging correction value, and a controller for reading the aging correction value from the memory and applying the aging correction value to the tuning device.

An oscillator with compensation for aging and temperature includes a crystal, a tuning device for tuning the frequency of oscillation of the crystal to a desired frequency of operation, an oscillator circuit connected to the crystal and the tuning device for causing the crystal to oscillate, a temperature sensing device for providing a temperature reading, a memory containing a plurality of frequency-temperature correction values and an aging correction value, and a controller for reading the temperature reading from the temperature sensing device, for reading the aging correction value from the memory, for reading a the frequency-temperature correction value from the memory for the temperature reading, for combining the aging correction value and the frequency-temperature correction value to provide a net correction value, and for applying the net correction value to the tuning device.

Another version of an oscillator with compensation for aging and temperature includes a crystal, a tuning device for tuning the frequency of oscillation of the crystal to a desired frequency of operation, an oscillator circuit connected to the crystal and the tuning device for causing the crystal to oscillate, a temperature sensing device for providing a temperature reading, a memory containing a plurality of combined temperature and aging correction values, and a controller for reading the temperature reading from the temperature sensing device, for reading a the combined temperature and aging correction value from the memory for the temperature reading, and for applying the combined temperature and aging correction value to the tuning device.

The present invention also provides a radiotelephone with compensation for aging and temperature. This radiotelephone includes a converter responsive to a received radio frequency (RF) signal and a local reference signal for providing an intermediate frequency (IF) signal, a limiter/demodulator connected to the converter and responsive to the IF signal for providing a limited IF signal and an audio signal, an audio circuit connected to the limiter/demodulator for providing an amplified audio output signal, a main oscillator for providing the local reference signal to the converter, a counter for determining a relationship between the local reference signal and the limited IF signal, a controller responsive to the relationship for determining and storing an aging correction value for the local oscillator, and responsive to the stored aging correction value for adjusting the frequency of the local reference signal, and a transmitter section responsive to the local reference signal and an audio input signal for providing a transmitted RF signal.

The converter in the radiotelephone includes a first local oscillator for providing a first local oscillator signal, a phase locked loop responsive to the first local oscillator signal and the local reference signal for controlling the frequency of the first local oscillator signal, a first mixer for combining the received RF signal and the local oscillator signal to provide a first IF signal, a second local oscillator responsive to the local reference signal for providing a second local oscillator signal, and a second mixer for combining the first IF signal and the second local oscillator signal to provide the IF signal to the limiter/demodulator.

The controller in the radiotelephone includes a memory for storing the aging correction value, and a microprocessor responsive to the relationship for determining the aging correction value, storing the aging correction value in the memory, and reading the aging correction value from the memory. In another version, the controller includes a memory for storing a table having a plurality of the aging correction value, each the aging correction value being for a predetermined temperature, and a microprocessor responsive to the relationship for determining the aging correction value, reading a temperature, storing the aging correction value in the table for the temperature, and reading the aging correction value for the temperature from the table in the memory.

The present invention also provides a receiver with compensation for aging and temperature. This receiver includes a converter responsive to a received radio frequency (RF) signal and a local reference signal for providing an intermediate frequency (IF) signal, a limiter/demodulator connected to the converter and responsive to the IF signal for providing a limited IF signal and an audio signal, an audio circuit connected to the limiter/demodulator for providing an amplified audio output signal, a main oscillator for providing the local reference signal to the converter, a counter for determining a relationship between the local reference signal and the limited IF signal, and a controller responsive to the relationship for determining and storing an aging correction value for the local oscillator, and responsive to the stored aging correction value for adjusting the frequency of the local reference signal.

The converter of the receiver includes a first local oscillator for providing a first local oscillator signal, a phase locked loop responsive to the first local oscillator signal and the local reference signal for controlling the frequency of the first local oscillator signal, a first mixer for combining the received RF signal and the local oscillator signal to provide a first IF signal, a second local oscillator responsive to the local reference signal for providing a second local oscillator signal, and a second mixer for combining the first IF signal and the second local oscillator signal to provide the IF signal to the limiter/demodulator.

The controller of the receiver includes a memory for storing the aging correction value, and a microprocessor responsive to the relationship for determining the aging correction value, storing the aging correction value in the memory, and reading the aging correction value from the memory. In another version the controller includes a memory for storing a table having a plurality of the aging correction value, each the aging correction value being for a predetermined temperature, and a microprocessor responsive to the relationship for determining the aging correction value, reading a temperature, storing the aging correction value in the table for the temperature, and reading the aging correction value for the temperature from the table in the memory.

Preferably, the radiotelephone or receiver will already have an automatic frequency control (AFC) procedure which causes the main oscillator to track the external reference signal. The result of the AFC procedure is used to determine the difference between the aging correction value already stored, and the aging correction value necessary to bring the oscillator frequency to within the desired tolerance. If the difference is too large then the difference may be an error, and so the aging correction value is not updated. If the difference is very small, then there is no need to update the aging correction value. If the difference is within this range then the aging correction value is updated. Preferably, the aging correction value is only tested and updated upon a power-up condition.

Other objects, features, and advantages of the present invention will become apparent upon reading the following description of the preferred embodiment, when taken in conjunction with the drawings and the claims.

BRIEF DESCRIPTION OF THE DRAWINGS

FIG. 1 is a block diagram of the preferred embodiment of the present invention.

FIG. 2 is a detailed block diagram of the preferred embodiment of the present invention.

FIGS. 3A–3C are a flow chart illustrating the process of the present invention.

DETAILED DESCRIPTION OF THE INVENTION

Figure 3A:
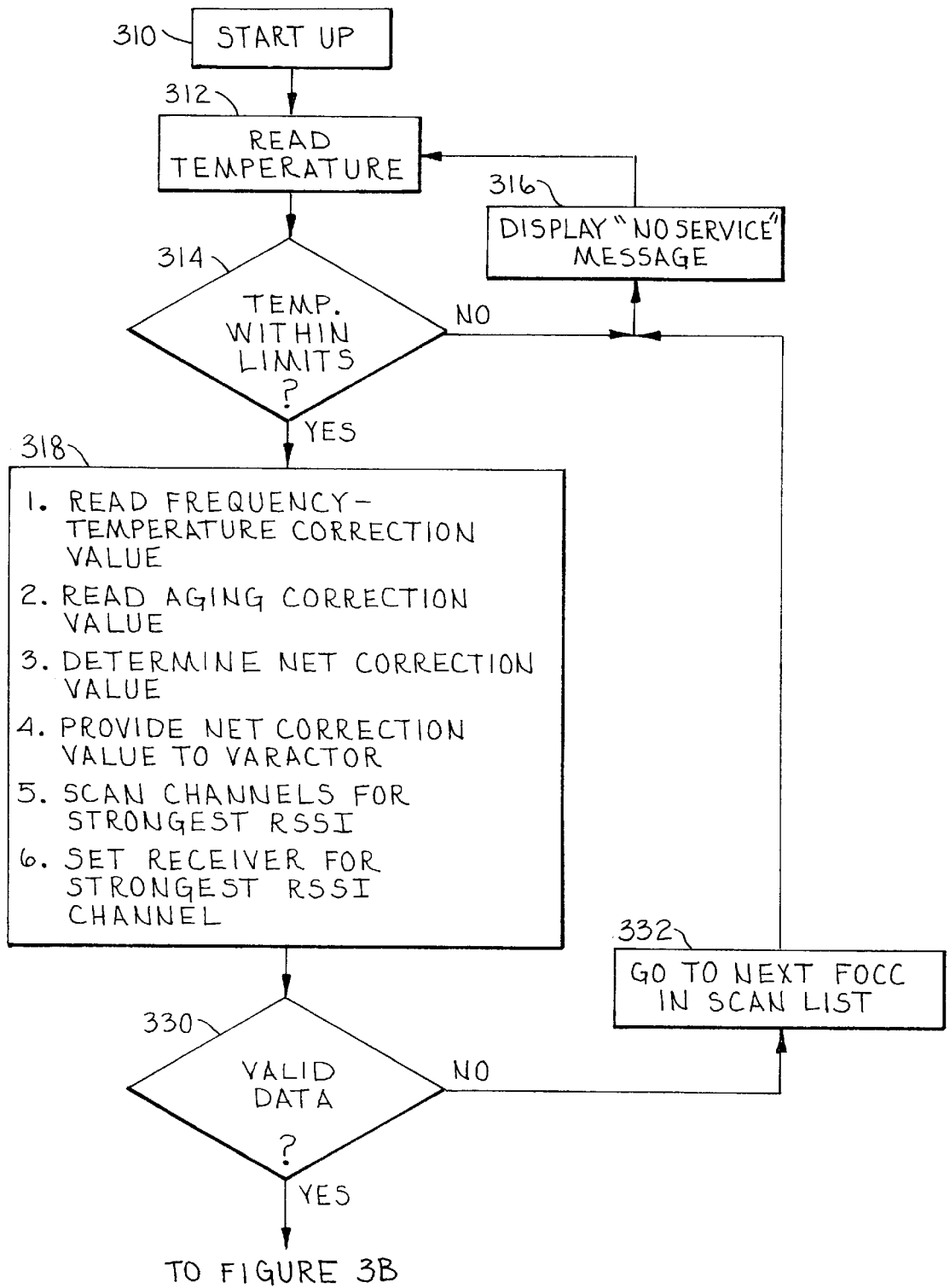

FIG. 1 is a block diagram of the preferred embodiment of the present invention. The preferred environment of the present invention is in a radiotelephone, such as a cellular telephone 110. Although the present invention is described herein in conjunction with a cellular mobile radiotelephone system, those skilled in the art will understand that the present invention is not so limited, and may find uses in communications and receiving systems of other types. The radiotelephone 110 includes a controller 112 that includes a microprocessor and other ancillary circuitry (not shown) needed to control and effect the operation of radiotelephone 110. In the preferred embodiment, controller 112 is a microcontroller which includes a microprocessor, read only memory (ROM), random access memory (RAM), and a non-volatile read/write memory, such as an electrically erasable programmable read only memory (EEPROM).

The controller 112 receives user inputs from a keypad 114. In addition to the digits constituting a telephone number to be called, the input from keypad 114 may include data pertaining to the operation of the radiotelephone, such as volume control, storage of telephone numbers, and the like. The controller 112 is also connected to indicators 116. These may include alphanumeric displays, lamps, miscellaneous indicators, and tone generators.

Radio frequency (RF) signals received via the antenna 118 are provided to the converters 120. The converters 120 convert the incoming RF signals to intermediate frequency (IF) signals. In the preferred embodiment, the IF center frequency is 450 kiloHertz (kHz). The output of the converters 120 is provided to the input of a limiter/demodulator 122. The limiter/demodulator 122 removes amplitude variations in the IF signal (LTD IF) and then demodulates the LTD IF signal, and then may apply filtering to separate and provide audio signals (AUDIO) and data signals (DATA). The audio signals are provided to a muting and audio amplifier circuit 124. The output of the muting and audio amplifier circuit 124 is the receiver section audio output which is provided to a speaker or a handset (not shown). The data signals are provided to the controller 112. The data signals represent commands from the Mobile Telephone Switching Office 108 (MTSO). These commands include, among other things, the appropriate channel for communications and the transmitter section power level. The controller 112 provides data to the converters 120 and to the muting and audio amplifier circuits 124. The controller 112 thereby controls the amount of RF and audio gain, whether muting should be applied, and the channel selection. The above configuration of components 120, 122 and 124 is referred to herein as a receiver section.

Audio input, such as speech from a microphone or a handset, or data from a modem or a facsimile machine (not shown), is provided to the input of a muting and audio amplifier circuit 126. The controller 112 controls the muting and also controls which audio signal (voice, modem data, fax data) is to be transmitted. The output of the muting and audio amplifier circuit 126 is connected to one input of a modulator circuit 128. A data output from controller 112 is connected to another input of the modulator circuit 128 to permit controller 112 to send data to the MITSO 108, such as a request for a channel, the telephone number to be called, the radiotelephone registration number, etc. The output of the modulator circuit 128 is provided to the input of oscillator circuit 130 which generates a modulated signal in accordance with the channel selection information provided by controller 112. The modulated signal output by the oscillator circuit 130 is then provided to a power amplifier circuit 132 where the modulated signal is amplified to the power level specified by the controller 112. The above configuration of components 126, 128, 130 and 132 is referred to herein as a transmitter section.

A main oscillator circuit 134, also referred to herein as a time base generator circuit, oscillates at a predetermined frequency to produce a local reference signal. The converters 120 and the oscillator circuit 130 use the local reference signal to set their respective oscillation frequencies. The main oscillator circuit 134 also provides a time base signal to the counter circuit 136. The time base signal is the local reference signal divided by a predetermined factor to provide a time base signal having a desired period, as discussed below.

The converters 120 and the oscillator circuit 130 use the local reference signal to set their respective oscillation frequencies. In the prior art, a high precision crystal oscillator has been used for the main oscillator 134. However, high precision crystal oscillators are expensive. Furthermore, although some high precision crystal oscillators compensate for temperature, none of them compensate for aging of the crystal. The present invention may, if desired, be used with a high precision crystal oscillator to compensate for aging of the crystal. However, the preferred embodiment of the present invention uses a lower cost crystal oscillator and still provides the desired frequency stability. Furthermore, the present invention compensates for aging of the crystal. The present invention achieves the desired precision and stability by comparing the oscillation frequency of the main oscillator 134 with the frequency of the received signal. The controller 112 notes the difference between the two frequencies and, if the difference exceeds a predetermined amount, updates the correction table for the crystal of the main oscillator 134.

When the radiotelephone 110 is in operation the controller 112 reads the temperature of the main oscillator 134 and then obtains a frequency-temperature correction table to determine the correction value necessary to compensate for the temperature. The frequency-temperature correction value is preferably obtained from a table. However, the frequency-temperature correction value may be obtained from an equation by which the correction value is calculated for a given temperature. The correction value determines the frequency of oscillation of the main oscillator 134 in the absence of an external reference, such as MTSO 108.

As previously stated, the time base output of the main oscillator/time base generator 134 is provided to one input of a counter 136. The limiter/demodulator 122 provides an amplitude-limited IF signal to another input of counter 136. Counter 136 counts the number of cycles of oscillation of the limited IF signal which occur during one cycle of oscillation of the time base signal. The time base signal provided by the time base generator 134 has a nominal period of approximately 68 milliseconds. This period is not critical and longer or shorter periods may be used. A shorter period, such as 17 milliseconds, gives a quicker response but is more susceptible to noise. A longer period, such as over 1 second, is less susceptible to noise but takes longer to perform the measurement and update procedure. The limited IF signal is a frequency-modulated signal but has an average, or center, frequency of 450 kHz if the time base generator 134 is exactly on frequency. The frequency of the IF signal is dependent upon the frequency of the signal from the MTSO 108 and the local oscillator frequencies generated in the converters 120. As will be seen below, the local oscillator frequencies are directly dependent upon the frequency of the main oscillator 134. Therefore, the frequency of the IF signal is directly dependent upon the frequency of the signal from the MTSO 108 and the frequency of the main oscillator 134. If the main oscillator 134 frequency is 15.36 MHz then the resulting IF signal frequency will be 450 kHz. Accordingly, counter 136 will count N cycles of the limited IF signal.

If the main oscillator 134 frequency is higher than 15.36 MHz then the resulting IF signal frequency will be higher than 450 kHz. Accordingly, counter 136 will count more (N+x) cycles of the limited IF signal. If the main oscillator 134 frequency is lower than 15.36 MHz then the resulting IF signal frequency will be lower than 450 kHz. Accordingly, counter 136 will count fewer cycles of the limited IF signal. Counter 136 provides this measured count to controller 112.

In the VCTCXO of the prior art, counter 136 is used to implement automatic frequency control (AFC). The received signal is the signal generated and transmitted by the MTSO 108. The MTSO 108 uses a high precision crystal, frequently oven-controlled, and so the transmissions by the MTSO 108 have a frequency of very high precision and stability, typically having an error of less than 0.2 parts per million. Accordingly, the VCTCXO tracks the signal from the MTSO 108. In the VCTCXO the controller 112 adjusts the frequency control signal until the measured count is the desired value. However, in the VCTCXO this information is not permanently stored. Therefore, when power is first applied to the VCTCXO, or when a radiotelephone controlled by a VCTCXO is in a non-service area, the VCTCXO will only be able to provide temperature compensation, and not aging compensation. If the aging is severe and the channel spacing is narrow, the inaccurate oscillator frequency may cause the radiotelephone to look on the wrong channel for the MTSO 108, thereby preventing communications from being established. Therefore, the VCTCXO is only useful if the temperature-compensated, but otherwise uncorrected, oscillation frequency is close enough to the proper frequency to allow the VCTCXO to tune to the proper channel.

In the preferred embodiment, as in the case of the VCTCXO, the signal transmitted by MTSO 108 is used as an external reference signal to calibrate the frequency of the main oscillator 134. Further, the present invention also uses the counter 136 of the AFC circuitry. However, in the preferred embodiment, the measured count information is stored and is used to control the frequency of the main oscillator even when the MTSO is not present, such as when the radiotelephone is searching for the MTSO upon powering up or when the radiotelephone is in or exiting a non-service area. Further, in the present invention, the controller 112 reads both a frequency-temperature correction value and an aging (offset) correction value to arrive at a net correction value. The aging correction value provides an offset to the frequency-temperature correction value to compensate for the effects of aging. This net correction value is then applied to the main oscillator 134.

Controller 112 compares the measured count to a predetermined reference count. If the measured count differs from this reference count by some predetermined error count then controller 112 changes the net correction value provided to the oscillator 134. This change in the net correction value causes the frequency of oscillation of main oscillator 134 to change. This, in turn, causes the local oscillators in the converters 120 to change frequency, which will cause the IF frequency to change, and which therefore causes the measured count to change. This change in the frequency of oscillation of main oscillator 134 also causes the oscillator 130 of the transmitter section to change frequency. Controller 112 then repeats the process of obtaining the measured count, comparing the measured count with the reference count, and changing the net correction value until the measured count is less than the predetermined error count. The result is that the frequency of oscillation moves closer to 15.36 MHz. Further, the converters 120 and the oscillator 130 also shift frequency so as to move closer to their respective desired frequencies because they are locked to the frequency of the main oscillator 134. Once the measured count is less than the predetermined error count the controller updates the aging correction value in a non-volatile memory, such as an EEPROM, associated with controller 112. Controller 112 may also, if desired, update the aging correction value each time that the net correction value is changed.

In the prior art, the frequency-temperature correction value has been independently determined for each individual crystal over the desired range of temperatures to provide a individualized frequency-temperature correction table. This allows for precise temperature compensation, but does not provide compensation for aging of the crystal. The present invention may, if desired, be used in conjunction with such an individualized frequency-temperature correction table. However, to reduce the cost of the radiotelephone 110, the present invention uses a frequency-temperature correction table or equation which is merely representative of a type of crystal, such as an AT-cut crystal. The present invention automatically customizes this representative table or equation for the individual crystal while the radiotelephone is in use by determining and storing an offset value which compensates for aging. In addition, this is a continuous updating process. In the preferred embodiment, the updating process is performed each time that the radiotelephone is power up. In this manner, as the crystal ages, the aging correction value is updated whenever the error in the frequency of the time base generator 134 exceeds a predetermined error amount.

Therefore, the present invention allows the desired frequency precision to be obtained by using a lower precision and lower cost crystal and oscillator circuit rather than using a higher precision, and higher cost, crystal and oscillator circuit.

Consider now the operation of the radiotelephone 110. When a radiotelephone is first turned on, or first enters an area of service, then the radiotelephone 110 must listen in on the correct channel in order to receive information from the MTSO 108. The prior art provided for temperature compensation, but not for aging compensation. Therefore, in the prior art, if the crystal had aged sufficiently and the channel spacing was narrow, the radiotelephone 110 would be listening for MTSO 108 on the wrong channel and would therefore be inoperative. Even if the frequency was close enough to receive instructions from the MTSO 108, the transmitted frequency could be so inaccurate as to cause some transmissions to be in the adjacent channel and therefore cause interference with other radiotelephones. However, the present invention provides an aging correction value. Therefore, a radiotelephone 110 according to the present invention will automatically compensate for the aging of the crystal and so the radiotelephone 110 will listen for the MTSO 108 on the correct channel and transmit on the correct channel, thus eliminating the problems of the prior art radiotelephones. In the preferred embodiment, the aging correction value is updated whenever the radiotelephone 110 is turned on. The update process may also be performed upon continuously, or upon the occurrence of some predetermined event, such as when the radiotelephone first enters an area where cellular telephone service is supported.

In the preferred embodiment, the existing controller 112 of the radiotelephone controls the frequency of main oscillator 134 and updates an aging correction value so as to reduce the cost of the radiotelephone 110. However, the present invention may also use a separate, dedicated controller to update and control the frequency of oscillation of time base generator 134.

In the preferred embodiment, the aging correction value is combined with, such as by adding to, the frequency-temperature correction value to provide a net correction value which is then applied to the main oscillator 134. Therefore, whenever an update is performed, the entire frequency-temperature correction table is effectively shifted by the aging correction value. This has the advantage in that the aging correction value is automatically applied for each temperature, thus providing for aging compensation even for temperatures which have not yet been encountered. In this embodiment, because the table is not altered, the table or equation may be stored in the ROM, rather than in the EEPROM, thereby providing for additional cost savings.

In one alternative embodiment, the aging correction value is not stored separately from the frequency-temperature correction value. Rather, the aging correction value which has been determined by the controller 112 is combined with the frequency-temperature correction value to produce a corrected frequency-temperature correction value, and this corrected value is then stored in the frequency-temperature correction table or equation. This has the advantage in that the controller 112 does not have to sum the two correction (temperature, aging) values each time that a new temperature is read. However, it does increase the amount of processing that controller 112 must do whenever an update is required.

In another alternative embodiment, the aging correction value which has been determined by the controller 112 is combined with the frequency-temperature correction value for the current temperature to produce a corrected frequency-temperature correction value, and this corrected value is then stored in the frequency-temperature correction table for the particular temperature at which the measurement was performed. This has the advantage of requiring fewer write operations to the EEPROM. However, this alternative embodiment could be disadvantageous where the radiotelephone is used for a long time in one climate, such as the warmer climate in a tropical or sub-tropical environment, and then used in a substantially different climate, such as an arctic or sub-arctic area in the winter. The correction values in the table for the lower temperatures would not have been updated to compensate for the aging and the error in the frequency could be substantial. The error could be severe enough to cause the radiotelephone to tune to an incorrect channel for instructions from the MTSO 108, or to cause the radiotelephone to transmit to the MTSO 108 on an incorrect channel. The result could be interference and/or the inability to communicate with the MTSO 108, thereby preventing any operation of the radiotelephone 110.

Turn now to FIG. 2, which is a detailed block diagram of the preferred embodiment of the present invention. Converters 120 comprise a low noise RF amplifier 210, a first mixer 212, an IF amplifier 214, a second mixer 216, a first local oscillator (LO) 220, a phase locked loop 222 for the oscillator 220, and a "times 6" frequency multiplier 224, which serves as the second local oscillator. The signal from antenna 118 is applied to amplifier 210 which then provides the amplified signal to one input of the mixer 212. The output of the first LO 220 is provided to another input of the mixer 212. The mixer 212 provides the resulting first IF signal to the IF amplifier 214. The first IF signal has a frequency of approximately 92.61 MHz. The IF amplifier 214 provides the amplified first IF signal to one input of the second mixer 216. The output of the multiplier 224 is provided to another input of the mixer 216. The mixer 216 provides the resulting second IF signal to the limiter/demodulator circuit 122. The second IF signal has a frequency of 450 kHz.

The 15.36 MHz time base reference signal from the main oscillator 134 is applied to the input of multiplier 224 so that the output of multiplier 224 has a frequency of 92.16 MHz. Therefore, the accuracy of the frequency of the output of the multiplier 224 is determined by the accuracy of the frequency of the main oscillator 134. The 15.36 MHz time base reference signal from the main oscillator 134 is also applied to one input of a phase locked loop 222 associated with the first LO 210. The output of the first LO 210 is applied to another input of PLL 222. The PLL 222 compares these two signals according to the ratio specified by the controller 112. The output of PLL 222 is applied to the frequency control input of the oscillator 220. Therefore, the accuracy of the frequency of the output of the first LO 220 is determined by the accuracy of the frequency of the main oscillator 134 and the accuracy of the comparison provided by the PLL 222.

The main oscillator 134 comprises a varactor 230, a crystal 232, and an oscillator/buffer circuit 234. The output frequency of the main oscillator is determined primarily by the crystal 232 but the circuit 234 and the varactor 230 also affect the output frequency. Preferably, the effect of the circuit 234 on the output frequency is either known or stable or both. The varactor 230 is used to adjust the frequency of oscillation of the crystal 232 to the desired frequency. The controller 112 provides a frequency control output signal which controls the capacitance provided by the varactor 230, and the capacitance provided by the varactor 230 affects the frequency of oscillation of the crystal 232 of the main oscillator 134. Therefore, controller 112 can control the frequency of operation of the main oscillator 134 and, accordingly, control the output frequencies from the first LO 220 and the multiplier 224. The main oscillator 134 also includes a temperature measuring device 236. In the preferred embodiment, three diodes are connected in series to provide an output voltage which is dependent upon the temperature. These diodes costs less than another commonly used temperature measuring device, a thermistor. Preferably, the temperature measuring device 236 is selected so that the output voltage-temperature curve is linear across the range of temperatures of interest. However, if the curve is non-linear, a table or an equation can be used to determine the temperature once the output voltage is measured. In the preferred embodiment, crystal 232 is a low cost strip AT-cut crystal, with an aging rate of less than 5 ppm per year, a manufacturer-specified ("make") tolerance of ±20 ppm, and a temperature stability of ±10 ppm from −30° C. to +60° C.

The controller 112 preferably comprises a microprocessor 240, analog-to-digital (A/D) converters 242 and 244, a read only memory (ROM) 246, a random access memory 248, an EEPROM 250, a pulse width modulator (PWM) 252, and a low pass (smoothing filter) 254. The ROM 246 and the RAM 248 are conventional in design and use. The EEPROM 250 contains the aging correction value and may contain a frequency-temperature correction table.

The output of the temperature measuring device 236 is applied to the input of the A/D converter 244. The output of converter 244 is applied to the temperature "TEMP" input of the microprocessor 240. The design and use of temperature measuring device 236 and converter 244 to measure the temperature of main oscillator 134 are conventional. The microprocessor 240 reads the temperature, accesses the frequency-temperature correction value in ROM 246 or EEPROM 250 to determine the correction needed to compensate for the temperature, accesses the aging correction value in the EEPROM 250, combines the two correction values to achieve a net correction value, and applies this net correction value to the main oscillator 134. Thus, the microprocessor 240 initially adjusts the frequency of the main oscillator 134 to compensate for changes in the temperature. Thereafter, the AFC circuitry maintains the tracking between the frequency of the main oscillator and the frequency of the MTSO. However, if the MTSO signal is lost and there is a significant temperature change, such as more than 8° C., then the frequency-temperature correction table will be used to set the frequency of the main oscillator until the MTSO can be located. It should be noted that, according to the present invention, the last update to the correction tables caused the main oscillator to be within 0.2 ppm of the desired frequency.

In the alternative embodiment wherein a plurality of frequency-temperature correction values are kept in a frequency-temperature correction table stored in EEPROM 250, and where these correction values have been updated to include the aging correction value, then the microprocessor 240 need only read the net correction value from the table in the EEPROM 250 and does not need to add any values.

The data output of the limiter/demodulator circuit 122 is applied to one data input of the microprocessor 240. The use of the circuit 122 to recover data transmitted by the MTSO from the received signal and provide the recovered data to the microprocessor 240 is well known.

The received signal strength indicator (RSSI) output of the limiter/demodulator circuit 122 is applied to the input of the A/D converter 242. The output of converter 242 is applied to the data input of the microprocessor 240. The use of the circuits 122 and 242 to provide information regarding the strength of the received signal to the microprocessor 240 is well known.

The amplitude-limited 450 kHz second IF (LTD IF) signal from limiter/demodulator 122 is applied to one input of the counter 136. The time base signal from the main oscillator 234 is applied to another input of the counter 136. Counter 136 counts how many cycles of the LTD IF signal occur during a cycle of the time base signal. This measured count is then provided to the microprocessor 240. When the aging correction value is to be updated, the microprocessor 240 compares this measured count to a predetermined reference count. If the difference (error) between the measured count and the predetermined reference count exceeds a predetermined error count then the microprocessor adjusts the frequency of the main oscillator 134, obtains the measured count, determines the error, compares the magnitude of the error, and so on, until the error is less than the predetermined error count. When the error is less than the predetermined error count then the microprocessor 240 updates the aging correction table in EEPROM 250 or, in one alternative embodiment, updates the frequency-temperature correction table in EEPROM 250. In the preferred embodiment, this comparison process is upon power up. However, in an alternative embodiment, this comparison process may be done continuously, or at predetermined intervals, for example, every hour, or upon the occurrence of a predetermined event or events, for example, entering a service area from a no-service area.

The frequency control output of microprocessor 240 is provided to the input of the pulse width modulator (PWM) circuit 252. The output of the PWM circuit 252 is provided to a smoothing (low-pass) filter 254. The output of the filter 254 is provided to the varactor 230 and controls the capacitance provided by the varactor 230. The modulator 252 and the filter 254 function as a digital-to-analog (D/A) converter to convert the digital signals output by the microprocessor 240 into analog signals which are useful to the varactor 230. Thus, the output of filter 254 controls the frequency of oscillation of the main oscillator 134. A 10 bit PWM was used instead of a conventional 8-bit D/A so as to decrease the output step size, decrease the cost, and increase the resolution of the oscillator. The PWM 252 was integrated into a section of a digital integrated circuit used in the radiotelephone 110.

Turn now to FIGS. 3A–3C which are a flow chart illustrating the process of the present invention. In the preferred embodiment, the controller 112 is not dedicated to the crystal frequency control process so the controller 112 also performs other operations 310. In the preferred embodiment, the updating process to compensate for the aging of the crystal is performed only on power up. When power is first applied 310 the controller 112 reads 312 the temperature provided by the temperature measuring device 236 and determines 314 if the temperature is within acceptable limits. If the temperature is less than −35° C. or greater than 85° C. then the controller 112 causes 316 the indicators 116 to display a "No Service" message. The controller 112 then returns to step 312. If the temperature is within the acceptable limits then the controller 112 performs 318 the following steps: read the frequency-temperature correction value from the memory; read the aging correction value from the memory; combine these values to determine the net correction value; apply, via the PWM 252 and filter 254, the frequency correction voltage to the varactor 230, thereby setting the frequency of oscillation of crystal 232; check the strength of the forward control channels (FOCCs) in the preprogrammed scan list of the radiotelephone for the strongest RSSI; and set the receiver of the radiotelephone for the FOCC with the strongest RSSI.

The controller 112 then begins monitoring and testing 330 for valid data on that FOCC. If word sync has not been found then the data is invalid and the controller 112 switches to the next strongest FOCC on the scan list. The controller 112 also causes 316 the indicators 116 to display a "No Service" message. The controller 112 then repeats steps 312, 314, 318, and 330.

If word sync has been found then the data is valid so the controller 112 causes 340 the indicators 116 to display the signal strength. The controller 112 then begins an AFC process. The controller 112 reads 342 the count from the counter 136 and determines 344 the difference between the actual count and a predetermined count of 30,735 (780 F in hexadecimal format). If the magnitude of the difference 346 is greater than 2 parts per million (ppm) then the controller 112 changes 348 the frequency correction voltage. In the environment of a radiotelephone, the center of the operating band is at approximately 836 MegaHertz. An error of 1 ppm is therefore ±836 Hz. After downconversion to the second IF frequency, this will cause the LTD IF signal to have a frequency of 450 kHz±836 Hz. If the timebase (about 68 milliseconds) is selected to cause a 450 kHz IF signal to provide a count of 30,735 then an IF signal having a frequency of 450.836 kHz will provide a count of 30,792. Therefore, a difference of 1 ppm corresponds to a difference (error) count of 57 (30,792−30,735). At this point, the controller determines 348 the voltage needed to tune the oscillator 134 to the desired frequency. The controller 112 has been preprogrammed with the information regarding the voltage step size needed to change the count by N counts or Y ppm. The controller 112 uses this information to calculate a step size which will bring the oscillation frequency close to the desired frequency in one step. A fixed, small step size can also be used but this increases the number of steps, and therefore the time, that is needed to bring the oscillation frequency to the desired frequency. The controller 112 then provides 350 this voltage to the varactor as the updated frequency correction voltage. Steps 342, 344, 346, 3248 and 350 are then repeated until the magnitude of the error is not greater than 2 ppm.

Once decision 346 determines that the magnitude of the error has been so reduced then the controller 112 switches to a smaller step size. This smaller step size allows the oscillation frequency to be changed in small steps so that the oscillation frequency closely matches the desired frequency.

The controller 112, accordingly, then 352 increments, or decrements, as appropriate, the frequency correction voltage and provides this new frequency correction voltage to the varactor 230. The controller 112 then 356 reads the count from the counter 136 and determines the difference between the count and a predetermined count of 780 F (hex). If the magnitude of the difference (error) 360 is not less than 0.5 parts per million (ppm) the controller 112 then 362 changes, by incrementing or decrementing, as appropriate, the frequency correction voltage and provides this new frequency correction voltage to the varactor 230. The controller 112 then returns to step 356. This process is repeated, using the last frequency step size, until the magnitude of the error is not greater than 0.5 ppm. At this point the radiotelephone is tuned to the proper frequency or channel and is ready to provide service to the user. If the magnitude of the difference at decision 360 is less than 0.5 ppm the controller 112 then determines 364 whether the aging update has been performed. In the preferred embodiment, the aging update is only performed after a power-up condition. However, it is possible to perform updates continuously, at predetermined intervals, or upon the occurrence of some specified event. If the aging update has been performed the controller 112 then 366 removes the call block, if not previously removed, so that calls may be made and received using the radiotelephone, waits for a predetermined time, such as two seconds, and then returns to step 356.

If at decision 364 the aging update has not yet been performed then the controller 112 compares 370 the frequency correction voltage actually applied to the varactor 230 with the frequency correction voltage predicted from the frequency correction table and the aging correction table. If at decision 372 the magnitude of the difference (error) between the actual frequency correction voltage and the predicted frequency correction voltage is less than 1 ppm or more than 3 ppm, then the aging correction value is not updated and the controller 112 returns to step 356. These figures are not critical. If the magnitude of the difference is less than 1 ppm then the aging correction value does not need to be updated. If the aging correction value is greater than 3 ppm then it is likely that the radiotelephone is tuned to the wrong frequency, such as might be caused by pulling from a strong transmitter. In this event, the aging correction value should not be updated because the update information may be erroneous and could cause problems the next time the radiotelephone is powered-up or enters a service area from a non-service area. This upper limit prevents an erroneous condition from causing an improper update of the aging correction value. An example of an erroneous condition is a strong local, non-MTSO transmitter transmitting on a frequency which is near the operating range of the radiotelephone. The strong signal may overpower the channel selection capability of the radiotelephone and attempt to "pull" the AFC off of the desired channel. In this case, the count will not be valid. Therefore, updating is not performed. If the error is between 1 and 3 ppm then updating may be performed.

If, at decision 372, the magnitude of the difference is within the limits the controller 112 then tests 374 whether the oscillator temperature is within the range of 15° to 35° C. If the temperature is within this range then the updating process may be performed. If the temperature is not within this range then the aging correction value is not updated and the controller 112 returns to step 356. This temperature range is not critical but updating is performed only if the temperature is within this range because it is preferred to perform updating only near the center of the frequency-temperature curve, rather than at the extremes of the curve.

The controller 112 then determines 376 whether the received signal is sufficiently strong to be reliable for updating, in this case, the received signal must be greater than −80 dBm. If the received signal is not strong enough then the aging correction value is not updated and the controller 112 returns to step 356.

The controller 112 then determines 378 whether the signal is stable. In other words, is the signal experiencing dropouts at a high rate? If so then the signal may not be reliable. In this case updating is not performed and the controller 112 returns to step 356. If the signal is reliable then the controller 112 checks 380 the error count to determine whether the magnitude of the error is less than 0.2 ppm. If not, then the AFC is not in a low error lock condition so updating is not performed and the controller 112 returns to step 356. If the magnitude of the error is less than 0.2 ppm then the AFC is in a low error lock condition so updating may be performed.

Accordingly, the controller 112 determines 382 a new offset voltage by determining the difference between the actual frequency control voltage and the predicted frequency control voltage. This new offset voltage is then stored 384 in the memory associated with the controller 112. The controller 112 has then completed the aging update process and so returns to step 356.

In the preferred embodiment, once the oscillator 134 has been tuned to the desired frequency, then the AFC counter and circuitry is used to keep the oscillator in tune. That is, the temperature need only be read and the frequency-temperature correction value need be determined only once, at power up. However, the controller 112 stores the start-up temperature and, if the reference signal (the signal from the MTSO) is lost, such as by driving into a tunnel, and the temperature changes by more than 8° C. from the start-up temperature, then the controller 112 will return to step 312 to obtain a net frequency correction value for the oscillator 134. However, as this is not a power-up condition, the controller 112 will not perform steps 370–384. However, this is a design choice and steps 370–384 could be performed, if desired. Also, the 8° C. change is a design choice, and other temperature changes may be used.

Step 318 discussed one method of determining the net correction value: reading the frequency correction value from the frequency-temperature correction table or equation, reading the aging correction value in the EEPROM 250, and combining these two correction values to provide the net correction value. Alternatively, the controller 112 may read a modified frequency-temperature correction value from the EEPROM 250. The value in the modified table compensates for both temperature and aging. In this case the controller 112, at steps 382 and 384, merely stores the actual correction value, rather than having to determine and store the aging offset value. The frequency-temperature table in this case is thus automatically modified, such as power up, to include the effects of aging of the crystal.

Steps/decisions 342 through 384 represent one way of determining whether the oscillation frequency is within tolerance, adjusting the oscillation frequency if not within tolerance, and storing (updating) an aging correction value. Other ways of achieving this result are also possible.

Updating is accomplished by storing an aging value, or a correction value, which represents the difference voltage, in the EEPROM 250. The difference voltage is the difference between the actual frequency control voltage and the frequency control voltage predicted by the table(s). Then, whenever the temperature is read and a frequency control voltage is read from the frequency-temperature table or equation, the aging correction voltage, which represents the offset voltage due to aging, is also read from the EEPROM 250 and is added to the frequency control voltage from the frequency-temperature table. This produces a corrected frequency control voltage, which is then applied to the main oscillator 134. In the preferred embodiment the frequency-temperature correction table is never changed because the aging correction value is separately stored as an offset or correction value. Therefore, the frequency-temperature correction table may be stored in the ROM 246, which reduces the amount of memory required in the EEPROM 250. Also, memory in a ROM 246 costs less than memory in an EEPROM 250.

The process of updating may also be accomplished by specifying a new frequency control voltage for each temperature in the frequency-temperature table. The frequency-temperature correction table is updated by adding the difference voltage, described above, to the frequency control value specified in the table for each frequency in the table. The updated frequency control voltage is then stored in the frequency-temperature correction table for that particular temperature. Thus, the frequency control voltage will have the aging correction value already included each time that the temperature is read and a frequency control voltage is read from the frequency-temperature table in the EEPROM 250.

It will be appreciated that the frequency-temperature correction table may, if desired, be represented by an equation which is stored in memory, such as the ROM or the EEPROM.

Regardless of the actual implementation used, the present invention effectively compares the frequency of the main oscillator 134 with the frequency of an external reference signal, such as MTSO 108, determines the amount of correction necessary to provide the desired accuracy of the frequency of the main oscillator 134, stores the correction value, and then uses the correction value to control the frequency of the main oscillator 134, even when the external reference is not present.

The present invention has been described above in the preferred environment of a radiotelephone. However, the present invention is useful with any type of transceiver where a reference signal is available. Further, the present invention is useful with any type of receiver where a reference signal is available. This has application where it is necessary to monitor a channel or a frequency for information. Whenever the channel or frequency is monitored, the present invention automatically updates the correction values to compensate for aging. Therefore, any time that the receiver is turned on, the oscillator in the receiver section will be operating on the correct channel or frequency. This provides for reliability of communications.

It will be appreciated from the above that the present invention allows the desired frequency precision to be obtained by using a low-cost crystal.

Although the present invention has been described with particularity with respect to its preferred environment, the present invention is not limited to radiotelephones. The present invention is also useful in any situation where a high precision, low cost oscillator is desired and an acceptable reference source is available for comparison.

It will be appreciated from the above that the present invention provides a method and an apparatus which compensate for aging of crystals.

It will also be appreciated from the above that the present invention provides a method and an apparatus for automatically determining the amount of aging that a crystal has suffered.

It will also be appreciated that the present invention provides a method and an apparatus for automatically compensating for the temperature of a crystal and the aging of the crystal without requiring a dedicated microprocessor.

It will also be appreciated that the present invention provides a method and an apparatus for automatically updating the frequency-temperature correction table for a crystal.

From a reading of the description above of the preferred embodiment of the present invention, modifications and variations thereto may occur to those skilled in the art. Therefore, the scope of the present invention is to be limited only by the claims below.

We claim:

1. A radiotelephone with compensation for temperature and aging of a crystal oscillator circuit using a reference frequency, comprising:

a converter responsive to a received radio frequency (RF) signal and a local reference signal for providing an intermediate frequency (IF) signal;

a limiter/demodulator connected to said converter and responsive to said IF signal for providing a limited IF signal and an audio signal;

an audio circuit connected to said limiter/demodulator for providing an amplified audio output signal;

a crystal oscillator circuit responsive to a frequency correction value for providing said local reference signal at a tunable frequency of operation;

a temperature sensing device for providing a temperature reading;

a controller having a plurality of frequency-temperature correction values and an aging correction value, for reading said temperature reading from said temperature sensing device, for selecting a said frequency-temperature correction value based upon said temperature reading, for combining said aging correction value and said selected frequency-temperature correction value to provide said frequency correction value, for applying said frequency correction value to said crystal oscillator circuit, for determining a frequency relationship between said local reference signal and said limited IF signal, for changing said frequency correction value by a first predetermined amount and providing said frequency correction value to said crystal oscillator circuit if said frequency relationship is greater than a first predetermined value, for determining whether said frequency relationship is greater than a second predetermined value if said frequency relationship is less than said first predetermined value, for changing said frequency correction value by a second predetermined amount and providing said frequency correction value to said crystal oscillator circuit if said frequency relationship is greater than said second predetermined value, and for updating said aging correction value to compensate for said frequency relationship if said frequency relationship is less than said second predetermined value by determining an updated aging correction value from said frequency correction value and said frequency-temperature correction value and storing said updated aging correction value as said aging correction value; and a transmitter section responsive to said local reference signal and an audio input signal for providing a transmitted RF signal.

2. The radiotelephone of claim 1 wherein said converter comprises:

a first local oscillator for providing a first local oscillator signal;

a phase locked loop responsive to said first local oscillator signal and said local reference signal for controlling the frequency of said first local oscillator signal;

a first mixer for combining said received RF signal and said local oscillator signal to provide a first IF signal;

a second local oscillator responsive to said local reference signal for providing a second local oscillator signal; and a second mixer for combining said first IF signal and said second local oscillator signal to provide said IF signal to said limiter/demodulator.

3. The radiotelephone of claim 1 wherein said controller comprises:

a memory for storing a table having said plurality of frequency-temperature correction values, and for storing said aging correction value, each said frequency-temperature correction value being for a predetermined temperature; and a microprocessor responsive to said frequency relationship for reading said temperature, for selecting said frequency-temperature correction value, for determining said frequency correction value, for determining said frequency relationship, for changing said frequency correction value, for determining said updated aging correction value, and for storing said updated aging correction value in said table in said memory.

4. The radiotelephone of claim 1 wherein said controller comprises a counter for determining said frequency relationship between said local reference signal and said limited IF signal.

5. A receiver with compensation for temperature and aging of a crystal oscillator circuit using a reference frequency, comprising:

a converter responsive to a received radio frequency (RF) signal and a local reference signal for providing an intermediate frequency (IF) signal;

a limiter/demodulator connected to said converter and responsive to said IF signal for providing a limited IF signal and an audio signal;

an audio circuit connected to said limiter/demodulator for providing an amplified audio output signal;

a crystal oscillator circuit responsive to a frequency correction value for providing said local reference signal at a tunable frequency of operation;

a temperature sensing device for providing a temperature reading; and a controller having a plurality of frequency-temperature correction values and an aging correction value, for reading said temperature reading from said temperature sensing device, for selecting a said frequency-temperature correction value based upon said temperature reading, for combining said aging correction value and said selected frequency-temperature correction value to provide said frequency correction value, for applying said frequency correction value to said crystal oscillator circuit, for determining a frequency relationship between said local reference signal and said limited IF signal, for changing said frequency correction value by a first predetermined amount and providing said frequency correction value to said crystal oscillator circuit if said frequency relationship is greater than a first predetermined value, for determining whether said frequency relationship is greater than a second predetermined value if said frequency relationship is less than said first predetermined value, for changing said frequency correction value by a second predetermined amount and providing said frequency correction value to said crystal oscillator circuit if said frequency relationship is greater than said second predetermined value, and for updating said aging correction value to compensate for said frequency relationship if said frequency relationship is less than said second predetermined value by determining an updated aging correction value from said frequency correction value and said frequency-temperature correction value and storing said updated aging correction value as said aging correction value.

6. The radiotelephone of claim 5 wherein said converter comprises:

a first local oscillator for providing a first local oscillator signal;

a phase locked loop responsive to said first local oscillator signal and said local reference signal for controlling the frequency of said first local oscillator signal;

a first mixer for combining said received RF signal and said local oscillator signal to provide a first IF signal;

a second local oscillator responsive to said local reference signal for providing a second local oscillator signal; and a second mixer for combining said first IF signal and said second local oscillator signal to provide said IF signal to said limiter/demodulator.

7. The radiotelephone of claim 5 wherein said controller comprises:

a memory for storing a table having said plurality of frequency-temperature correction values, and for storing said aging correction value, each said frequency-temperature correction value being for a predetermined temperature; and a microprocessor responsive to said frequency relationship for reading said temperature, for selecting said frequency-temperature correction value, for determining said frequency correction value, for determining said frequency relationship, for changing said frequency correction value, for determining said updated aging correction value, and for storing said updated aging correction value in said table in said memory.

8. The radiotelephone of claim 5 wherein said controller comprises a counter for determining said frequency relationship between said local reference signal and said limited IF signal.

9. A radiotelephone with compensation for temperature and aging of a crystal oscillator circuit using a reference frequency, comprising:

a converter responsive to a received radio frequency (RF) signal and a local reference signal for providing an intermediate frequency (IF) signal;

a limiter/demodulator connected to said converter and responsive to said IF signal for providing a limited IF signal and an audio signal;

an audio circuit connected to said limiter/demodulator for providing an amplified audio output signal;

a crystal oscillator circuit responsive to a frequency correction value for providing, said local reference signal at a tunable frequency of operation;

a temperature sensing device for providing a temperature reading;

a controller having a plurality of combined frequency-temperature and aging correction values, for reading said temperature reading from said temperature sensing device, for selecting a said combined frequency-temperature and aging correction value based upon said temperature reading to provide a frequency correction value, for applying said frequency correction value to said crystal oscillator circuit, for determining a frequency relationship between said local reference signal and said limited IF signal, for changing said frequency correction value by a first predetermined amount and providing said frequency correction value to said crystal oscillator circuit if said frequency relationship is greater than a first predetermined value, for determining whether said frequency relationship is greater than a second predetermined value if said frequency relationship is less than said first predetermined value, for changing said frequency correction value by a second predetermined amount and providing said frequency correction value to said crystal oscillator circuit if said frequency relationship is greater than said second predetermined value, and for updating, said selected combined frequency-temperature and aging correction value to compensate for said frequency relationship if said frequency relationship is less than said second predetermined value by determining an updated combined frequency-temperature and aging correction value from said frequency correction value and storing said updated combined frequency-temperature and aging correction value as said selected combined frequency-temperature and aging correction value; and a transmitter section responsive to said local reference signal and an audio input signal for providing a transmitted RF signal.

10. The radiotelephone of claim 9 wherein said converter comprises:

a first local oscillator for providing a first local oscillator signal;

a phase locked loop responsive to said first local oscillator signal and said local reference signal for controlling the frequency of said first local oscillator signal;

a first mixer for combining said received RF signal and said local oscillator signal to provide a first IF signal;

a second local oscillator responsive to said local reference signal for providing a second local oscillator signal; and a second mixer for combining said first IF signal and said second local oscillator signal to provide said IF signal to said limiter/demodulator.

11. The radiotelephone of claim 9 wherein said controller comprises:

a memory for storing a table having said plurality of said combined frequency-temperature and aging correction values, and for storing said combined frequency-temperature and aging correction value, each said combined frequency-temperature and aging correction value being for a predetermined temperature; and a microprocessor responsive to said frequency relationship for reading said temperature, for selecting said combined frequency-temperature and aging correction value, for determining said frequency correction value, for determining said frequency relationship, for changing said frequency correction value, for determining said updated combined frequency-temperature and aging correction value, and for storing said updated combined frequency-temperature and aging correction value in said table in said memory.

12. The radiotelephone of claim 9 wherein said controller comprises a counter for determining said frequency relationship between said local reference signal and said limited IF signal.

13. A receiver with compensation for temperature and aging of a crystal oscillator circuit using a reference frequency, comprising:

a converter responsive to a received radio frequency (RF) signal and a local reference signal for providing an intermediate frequency (IF) signal;

a limiter/demodulator connected to said converter and responsive to said IF signal for providing a limited IF signal and an audio signal;

an audio circuit connected to said limiter/demodulator for providing an amplified audio output signal;

a crystal oscillator circuit responsive to a frequency correction value for providing said local reference signal at a tunable frequency of operation;

a temperature sensing device for providing a temperature reading; and a controller having a plurality of combined frequency-temperature and aging correction values, for reading said temperature reading from said temperature sensing device, for selecting a said combined frequency-temperature and aging correction value based upon said temperature reading to provide a frequency correction value, for applying said frequency correction value to said crystal oscillator circuit, for determining a frequency relationship between said local reference signal and said limited IF signal, for changing said frequency correction value by a first predetermined amount and providing said frequency correction value to said crystal oscillator circuit if said frequency relationship is greater than a first predetermined value, for determining whether said frequency relationship is greater than a second predetermined value if said frequency relationship is less than said first predetermined value, for changing said frequency correction value by a second predetermined amount and providing said frequency correction value to said crystal oscillator circuit if said frequency relationship is greater than said second predetermined value, and for updating said selected combined frequency-temperature and aging correction value to compensate for said frequency relationship if said frequency relationship is less than said second predetermined value by determining an updated combined frequency-temperature and aging correction value from said frequency correction value and storing said updated combined frequency-temperature and aging correction value as said selected combined frequency-temperature and aging correction value.

14. The radiotelephone of claim 13 wherein said converter comprises:

a first local oscillator for providing a first local oscillator signal;

a phase locked loop responsive to said first local oscillator signal and said local reference signal for controlling the frequency of said first local oscillator signal;

a first mixer for combining said received RF signal and said local oscillator signal to provide a first IF signal;

a second local oscillator responsive to said local reference signal for providing a second local oscillator signal; and a second mixer for combining said first IF signal and said second local oscillator signal to provide said IF signal to said limiter/demodulator.

15. The radiotelephone of claim 13 wherein said controller comprises:

a memory for storing a table having said plurality of frequency-temperature correction values, and for storing said aging correction value, each said frequency-temperature correction value being for a predetermined temperature; and a microprocessor responsive to said frequency relationship for reading said temperature, for selecting said frequency-temperature correction value, for determining said frequency correction value, for determining said frequency relationship, for changing said frequency correction value, for determining said updated aging correction value, and for storing said updated aging correction value in said table in said memory.

16. The radiotelephone of claim 13 wherein said controller comprises a counter for determining said frequency relationship between said local reference signal and said limited IF signal.

* * * * *